(12) United States Patent
Gupta et al.

(10) Patent No.: US 6,884,630 B2
(45) Date of Patent: Apr. 26, 2005

(54) TWO-STEP MAGNETIC TUNNEL JUNCTION STACK DEPOSITION

(75) Inventors: Arunava Gupta, Valley Cottage, NY (US); Kia-Seng Low, Hopewell Junction, NY (US)

(73) Assignees: Infineon Technologies AG, Munich (DE); Internation Business Machines Corporation, Armonk, NY (US)

(*) Notice: Subject to any disclaimer, the term of this patent is extended or adjusted under 35 U.S.C. 154(b) by 0 days.

(21) Appl. No.: 10/348,235

(22) Filed: Jan. 21, 2003

(65) Prior Publication Data

US 2004/0087039 A1 May 6, 2004

Related U.S. Application Data

(60) Provisional application No. 60/422,200, filed on Oct. 30, 2002.

(51) Int. Cl.[7] .............................................. H01L 21/00
(52) U.S. Cl. .......................... 438/3; 438/381; 438/951
(58) Field of Search ........................... 438/3, 238, 381, 438/595, 951

(56) References Cited

U.S. PATENT DOCUMENTS

| | | | |
|---|---|---|---|
| 6,174,737 B1 | * | 1/2001 | Durlam et al. ................. 438/3 |
| 6,345,435 B1 | | 2/2002 | Han et al. |
| 6,653,154 B2 | * | 11/2003 | Doan et al. ..................... 438/3 |
| 6,689,622 B1 | * | 2/2004 | Drewes ......................... 438/3 |
| 6,727,105 B1 | | 4/2004 | Brug et al. |
| 2002/0047145 A1 | | 4/2002 | Nickel |
| 2003/0199167 A1 | | 10/2003 | Tuttle |

FOREIGN PATENT DOCUMENTS

EP 1 132 920 A2 9/2001

OTHER PUBLICATIONS

Kumagai, S, et al., "Spin Tunneling Magnetoresistance in NiFe/Al$_2$O$_3$.Co Junctions With Reduced Dimensions Formed Using Photolithography," Journal of Magnetic and Magnetic Materials, 1997, pp. 71–74, vol. 166, No. 1–2, Elsevier Science Publishers, Amsterdam, NL.

* cited by examiner

*Primary Examiner*—Chandra Chaudhari
(74) *Attorney, Agent, or Firm*—Slater & Matsil, L.L.P.

(57) ABSTRACT

Magnetic tunnel junction devices can be fabricated using a two-step deposition process wherein respective portions of the magnetic tunnel junction stack are defined independently of one another.

49 Claims, 3 Drawing Sheets

US 6,884,630 B2

TWO-STEP MAGNETIC TUNNEL JUNCTION STACK DEPOSITION

This application claims the priority under 35 U.S.C. 119(e)(1) of copending U.S. Provisional Application No. 60/422,200, filed on Oct. 30, 2002 and incorporated herein by reference.

This invention was made with U.S. Government support under MDA972-99-C-0009 awarded by the Defense Advanced Research Projects Agency (DARPA). The U.S. Government has certain rights in this invention.

FIELD OF THE INVENTION

The invention relates generally to magnetic tunnel junction devices and, more particularly, to the fabrication of magnetic tunnel junction devices.

BACKGROUND OF THE INVENTION

Magnetic tunnel junction devices and their uses are well-known in the art. Conventional magnetic tunnel junction (MTJ) devices typically include a bottom contact electrode, a bottom magnetic layer, an oxidized Al barrier layer, a top magnetic layer and a top contact electrode. These devices are typically fabricated using a single deposition step that deposits all of the constituent layers as a complete stack. The complete stack is subsequently patterned to define the magnetic tunnel junction devices. MTJ devices fabricated in this manner can exhibit shorting through the barrier layer and magnetic coupling between the two magnetic electrodes.

It is therefore desirable to reduce the incidence of the aforementioned shorting and magnetic coupling phenomena. The present invention can reduce the incidence of these phenomena by using a two-step deposition process to deposit the MTJ stack, wherein respective portions of the MTJ stack are defined independently of one another.

DETAILED DESCRIPTION

According to exemplary embodiments of the invention, MTJ devices can be fabricated using a two-step deposition process where a bottom portion of the stack, up to the tunnel barrier layer, is deposited in a first deposition step, which first step can also include deposition of a sacrificial cap layer over the tunnel barrier layer. Patterning and etching are then applied to the deposited portion of the stack, after which the top magnetic layer and top contact electrode are deposited in a second deposition step. Such fabrication of an MTJ device using two deposition steps with patterning and etching steps therebetween can reduce the incidence of shorting through the barrier and magnetic coupling between the magnetic electrodes. The sacrificial cap layer protects the integrity of the barrier layer during the patterning and etching steps which occur between the two aforementioned deposition steps. Because the second deposition occurs after patterning and associated etching, the upper magnetic layer and the upper contact electrode of the MTJ device can be designed to have a smaller cross-sectional area than the remaining, lower layers of the MTJ stack, which can help further to reduce shorting through the barrier layer and magnetic coupling between the magnetic electrodes.

It should be noted that the layers illustrated in FIGS. 1–18 are provided for explanatory purposes, and their dimensions are not necessarily shown to scale.

Figure 1:
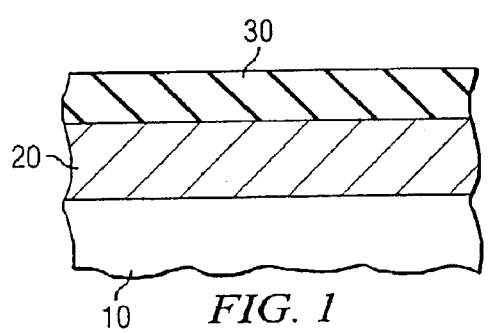
FIGS. 1 and 2 are diagrammatic cross-sectional illustrations of a portion of an MTJ device stack produced by a first deposition step according to the invention.
Figure 2:
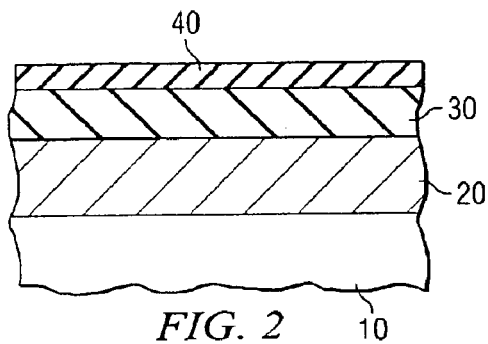

FIGS. 1 and 2 illustrate the first deposition step of a two-step deposition process for producing an MTJ device according to exemplary embodiments of the invention. In this first step, the following layers are deposited on a substrate 10: the bottom contact electrode and bottom magnetic layer, illustrated generally at 20; the oxidized tunnel barrier (e.g., Ta/TaN/PtMn/CoFe/Al (ox)) layer, illustrated generally at 30; and a thin cap layer, illustrated generally at 40. The cap layer 40, in some embodiments, is deposited as a part of the process of the first step deposition, without breaking vacuum. The cap layer 40 is provided to help prevent degradation of the barrier layer 30 after air-exposure and during subsequent processing. The cap layer 40 is thus a sacrificial layer, and can be easily removed under mild etch conditions, prior to deposition of the top magnetic layer, without affecting the properties of the barrier layer 30. Exemplary materials for use in the cap layer 40 include Ru and diamond-like-carbon (DLC) of, for example, approximately 50–100 angstroms thickness. Such a cap layer can be easily etched in an oxygen plasma without leaving any residue and without damaging the oxide tunnel barrier 30. In some embodiments, DLC is preferred for the cap layer, in order to avoid any shorting at the edges.

Figure 3:
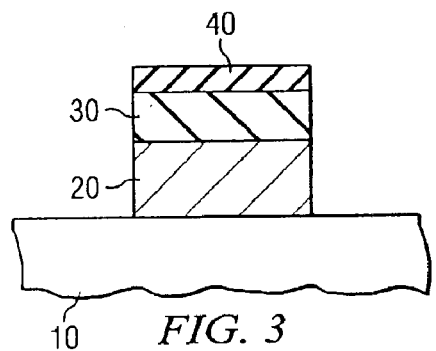
FIG. 3 is a diagrammatic cross-sectional illustration of a resulting portion of an MTJ device after patterning and etching are applied to the structure of FIG. 2 according to the invention.
Figure 4:
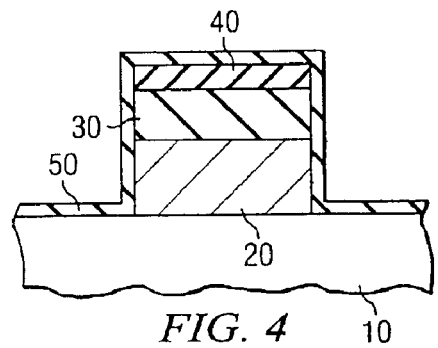
FIG. 4 is a diagrammatic cross-sectional illustration of a resulting portion of an MTJ device after encapsulation is applied to the structure of FIG. 3 according to the invention.
Figure 5:
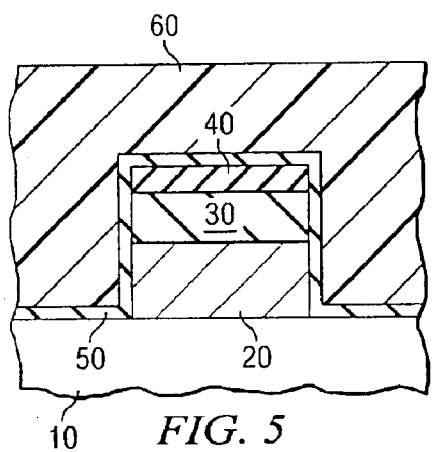
FIG. 5 is a diagrammatic cross-sectional illustration of a resulting portion of an MTJ device after inter-level dielectric (ILD) deposition and chemical-mechanical polishing (CMP) are applied to the structure of FIG. 4 according to the invention.

As shown in FIG. 3, the layers deposited in the deposition step of FIGS. 1 and 2 can be patterned and etched in conventional fashion to define the bottom stack portion of the MTJ device. Thereafter, as illustrated in FIG. 4, a conventional encapsulation step can be performed to provide an encapsulation layer 50 (e.g., SiN) to protect the edges. The encapsulation step is followed by conventional ILD deposition and CMP. The resulting ILD layer is illustrated generally at 60 in FIG. 5.

Figure 6:
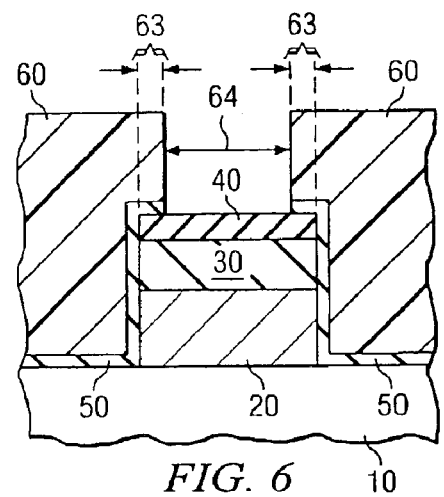
FIG. 6 is a diagrammatic cross-sectional illustration of a resulting portion of an MTJ device after a contact etch is applied to the structure of FIG. 5 according to the invention.

As shown in FIG. 6, conventional techniques can be used to etch a contact opening through the ILD layer 60 and the encapsulation layer 50, to reach the cap layer 40.

Figure 7:
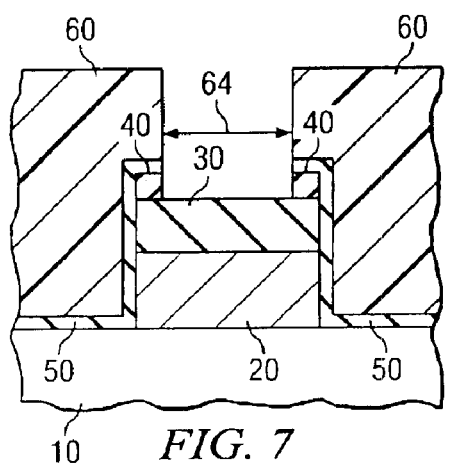
FIG. 7 is a diagrammatic cross-sectional illustration of a resulting portion of an MTJ device after the cap layer is removed from the structure of FIG. 6 according to the invention.

Thereafter, as shown in FIG. 7, conventional techniques can be used to perform an in situ etch removal of a portion of the cap layer 40 to produce an opening through the cap layer.

Figure 8:
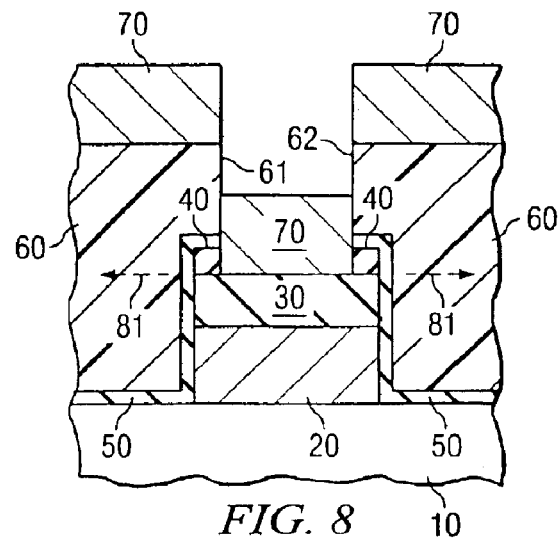
FIG. 8 is a diagrammatic cross-sectional illustration of an MTJ device resulting from deposition of a top magnetic layer and contact electrode onto the structure of FIG. 7 according to the invention.

FIG. 8 illustrates the second deposition step of the two-step MTJ deposition process according to exemplary embodiments of the invention. In this deposition step, the upper magnetic and contact layers (e.g., NiFe/TaN), illustrated generally at 70, are deposited to define the upper portion of the MTJ stack within the openings in layers 40 and 60. In some exemplary embodiments, a directional deposition process is used to deposit the upper magnetic and contact layers, in order to prevent buildup on the side walls (61, 62) produced by the etch step of FIG. 6.

Figure 9:
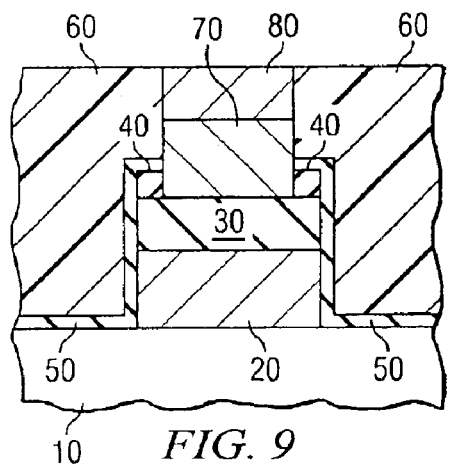
FIG. 9 is a diagrammatic cross-sectional illustration of the MTJ device of FIG. 8 after a top metal (M3) layer deposition and CMP according to the invention.

As illustrated in FIG. 9, conventional techniques can be used to deposit the top metal (M3) layer 80 (e.g., Cu, W, or Al (Cu)), followed by conventional CMP.

Referring again to FIGS. 6–8, the use of a second deposition step for the upper portion of the MTJ stack permits the upper stack portion (e.g., the layers at 70) to be designed in some exemplary embodiments with a smaller cross-sectional area than the adjacent lower stack portion (e.g. at 20, 30), in the plane 81 where the upper stack portion generally adjoins the lower stack portion. This can further reduce shorting through the barrier layer 30, and can also further reduce magnetic coupling between the two magnetic electrodes. As an example, the offset distance 63 can be approximately 100–1000 nm, and the contact opening dimension 64 can be approximately 100–500 nm.

An alternate exemplary approach that employs a lift-off technique using photoresist can also be used as illustrated in FIGS. 10–18.

Figure 10:
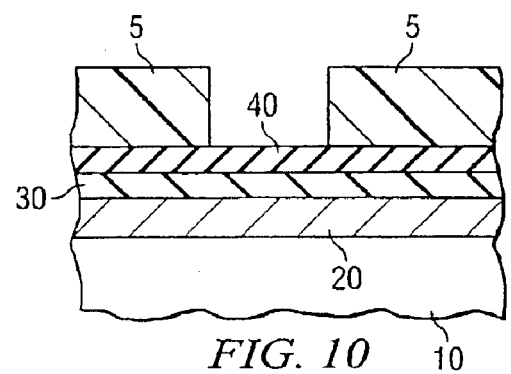
FIG. 10 is a diagrammatic cross-sectional illustration of a resulting portion of an MTJ device after a photoresist layer is patterned onto the structure of FIG. 2.
Figure 11:
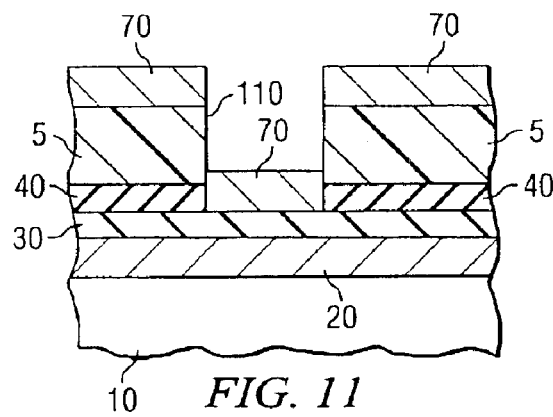
FIG. 11 is a diagrammatic cross-sectional illustration of a resulting portion of an MTJ device after removal of the cap layer and deposition of a top magnetic layer and contact electrode relative to the structure of FIG. 10.

Beginning with the structure of FIG. 2, a photoresist layer 5 can be patterned onto the cap layer 40 with an opening therein (using conventional techniques) to aid in defining the upper portion of the MTJ stack, as shown in FIG. 10. Thereafter, as shown in FIG. 11, conventional techniques can be used to perform an in situ etch removal of a portion of the cap layer 40 to produce an opening through the cap layer. Thereafter, and also as shown in FIG. 11, a second deposition step is performed. In this deposition step, the upper magnetic and contact layers (e.g., NiFe/TaN), illustrated generally at 70, are deposited to define the upper portion of the MTJ stack within the openings in photoresist layer 5 and cap layer 40. In some exemplary embodiments, a conventional directional deposition process is used to deposit the upper magnetic and contact layers 70.

Figure 12:
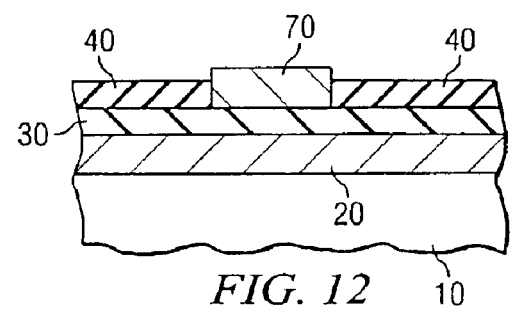
FIG. 12 is a diagrammatic cross-sectional illustration of a resulting portion of an MTJ device after lift-off of the photoresist layer of FIG. 11.
Figure 13:
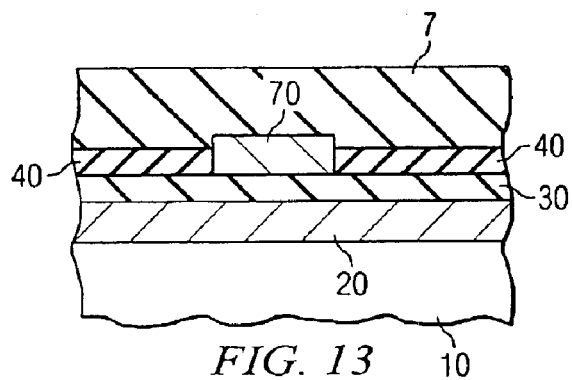
FIG. 13 is a diagrammatic cross-sectional illustration of a resulting portion of an MTJ device after deposition of a hardmask layer onto the structure of FIG. 12.

As shown in FIG. 12, the photoresist layer 5 and corresponding overlying portions of the upper magnetic and contact layer 70 can be removed using, for example, a conventional wet etch lift-off technique. Thereafter, as shown in FIG. 13, a hardmask 7 is deposited. The hardmask can be, for example, an oxide or a nitride (e.g., SiN or TaN).

Figure 14:
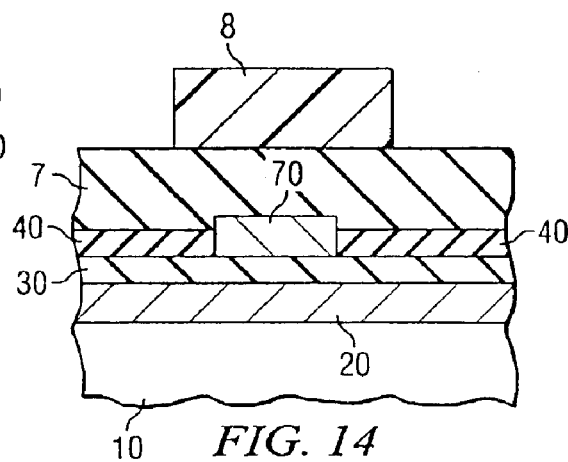
FIG. 14 is a diagrammatic cross-sectional illustration of a resulting portion of an MTJ device after application of a photoresist layer to the structure of FIG. 13.
Figure 15:
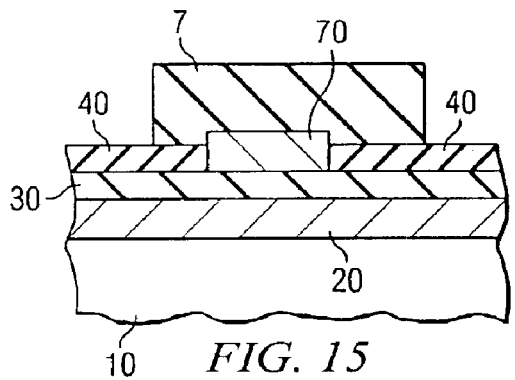
FIG. 15 is a diagrammatic cross-sectional illustration of a resulting portion of an MTJ device after etching the hardmask of the structure of FIG. 14 and removing the photoresist layer.

As shown in FIG. 14, a photoresist layer 8 is used to pattern the lower portion (20 and 30) of the MTJ stack. Conventional techniques can then be used to etch the hardmask 7 and thereafter remove the photoresist layer 8. The result is illustrated in FIG. 15.

Figure 16:
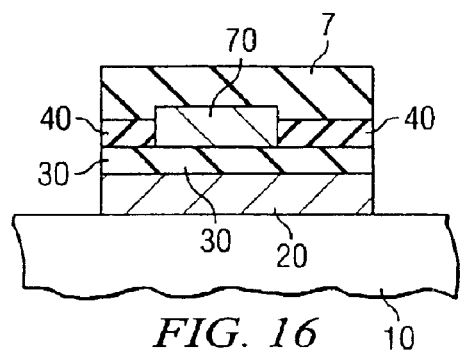
FIG. 16 is a diagrammatic cross-sectional illustration of a resulting portion of an MTJ device after using the hardmask of FIG. 15 as a pattern to etch the cap layer, tunnel barrier layer and lower magnetic layer of FIG. 15.

Thereafter, as shown in FIG. 16, the hardmask 7 is used as a pattern to etch the layers 20, 30 and 40 to thereby define the lower portion 20, 30 of the MTJ stack. In the illustrated embodiments, the hardmask 7 is larger than the upper stack portion 70, so the upper stack portion has a smaller cross-sectional area than the adjacent lower stack portion at 20 and 30, as illustrated in FIG. 16.

Figure 17:
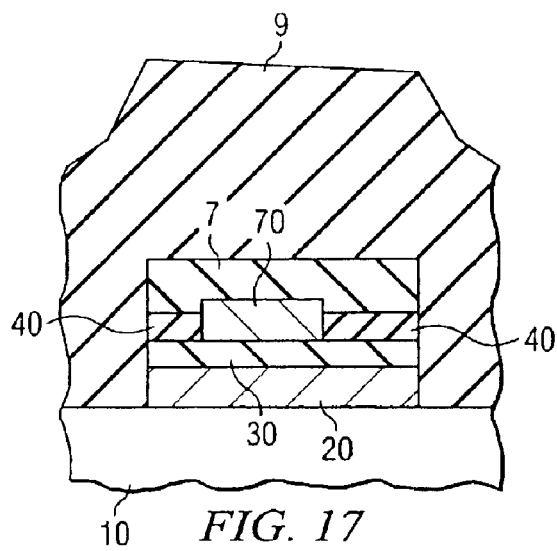
FIG. 17 is a diagrammatic cross-sectional illustration of the structure of FIG. 16 after encapsulation.
Figure 18:
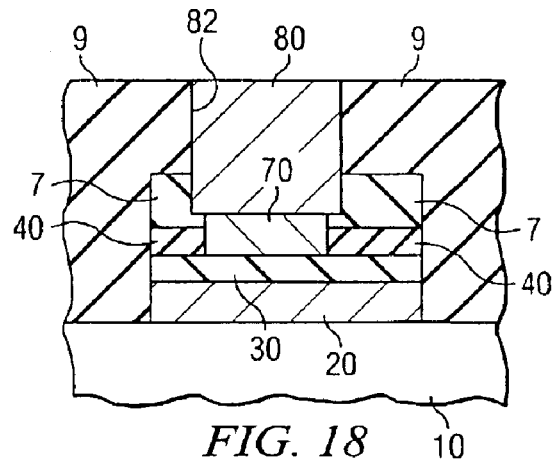
FIG. 18 is a diagrammatic cross-sectional illustration of an MTJ device that results from forming a via through the encapsulant and hardmask, and depositing a metal layer in the via.

After the MTJ stack of FIG. 16 is encapsulated with, for example, an oxide encapsulant 9 as shown in FIG. 17, conventional techniques can be used to produce (as shown in FIG. 18) a via 82 through the encapsulant 9 and the hardmask 7 to the upper stack portion at 70, and to deposit the top metal (M3) layer 80 in the via 82. Conventional CMP can then be performed, and the result is shown in FIG. 18.

In some exemplary embodiments, the photoresist layers 5 and 8 of FIGS. 10 and 14, respectively, can be appropriately patterned such that the relationship between the cross-sectional areas of the upper (70) and lower (20, 30) MTJ stack portions is governed by the same dimensions 63 and 64 described above with respect to FIGS. 6 and 7.

Although exemplary embodiments of the invention have been described above in detail, this does not limit the scope of the invention, which can be practiced in a variety of embodiments.

What is claimed is:

1. A method of fabricating a magnetic tunnel junction device including a plurality of layers configured as a stack of layers, comprising:

depositing magnetic layer and a tunnel barrier layer suitable for use as a first portion of the stack on an exposed area of a substantially flat substrate;

etching the deposited magnetic layer and the tunnel barrier layer to define a substantially flat first portion of the stack; and after said etching step, depositing a second portion of the stack on said substantially flat first portion of the stack.

2. A method of fabrication a magnetic tunnel junction device including a plurality of layers configured as a stack of layers, comprising;

depositing on a substrate a material suitable for use as a first portion of the stack;

covering said deposited material with a protective cap layer; and then etching the deposited material to define said first portion of the stack; and after said etching step, depositing a second portion of the stack on said substantially flat first portion of the stack.

3. The method of claim 2, wherein said first-mentioned depositing step includes said covering step.

4. The method of claim 2, wherein said first portion includes a magnetic layer and a tunnel barrier layer.

5. The method of claim 2, including, after said etching step and before said last-mentioned depositing step, etching part of said protective cap layer to expose part of said first portion while maintaining another part of said first portion covered by said protective cap layer.

6. The method of claim 5, wherein said last-mentioned etching step includes etching through said protective cap layer an opening having a cross-sectional area that is smaller than a cross-sectional area of said first portion in a plane where said first portion generally adjoins said protective cap layer.

7. The method of claim 6, wherein said last-mentioned depositing step includes depositing said second portion into said opening.

8. The method of claim 7, wherein said first portion includes a magnetic layer and a tunnel barrier layer.

9. The method of claim 6, including, after said first-mentioned etching step and before said last-mentioned etching step, providing a further layer in overlying relationship relative to said protective cap layer and etching through said further layer a further opening having a cross-sectional area approximately equal to said cross-sectional area of said opening in said protective cap layer.

10. The method of claim 9, wherein said last-mentioned depositing step includes performing a directional deposition process to deposit said second portion into said further opening.

11. The method of claim 9, wherein said further layer is a dielectric layer.

12. The method of claim 5, wherein said step of etching said protective cap layer includes performing an in situ etch of said protective cap layer.

13. The method of claim 2, wherein said protective cap layer is one of a Ru layer and a DLC layer.

14. The method of claim 13, wherein said protective cap layer has a thickness in a range of approximately 50–100 angstroms.

15. The method of claim 2, wherein said protective cap layer has a thickness in a range of approximately 50–100 angstroms.

16. A method of fabricating a magnetic tunnel junction device including a plurality of layers configured as a stack of layers, comprising:
  providing on an exposed area of a substantially flat substrate a substantiallly flat first magnetic layer and a tunnel barrier layer suitable for use on a first portion of the stack;
  depositing on said magnetic material and the tunnel barrier layer a second material that, as deposited, defines a second portion of the stack; and
  etching said magnetic material and the tunnel barrier layer to define said first portion of the stack.

17. A method of fabricating a magnetic tunnel junction device including a plurality of layers configured as a stack of layers, comprising:
  depositing on a substrate a first material suitable for use as a first portion of the stack;
  covering said first material with a protective cap layer;
  removing a portion of the protective cap layer to expose said first material;
  depositing a second material that, as deposited, defines a second portion of the stack; and
  etching said first material to define said first portion of the stack.

18. The method of claim 17, wherein said step of removing a portion of said protective cap layer includes etching away said portion of the protective cap layer to produce in the protective cap layer an opening for use in defining said second portion of the stack, said second material depositing step including depositing said second portion of the stack into said opening.

19. The method of claim 16, wherein said depositing step includes depositing on the firs material a photoresist layer that is patterned for use in defining said second portion of the stack.

20. The method of claim 19, wherein said second material depositing step includes depositing said second portion of the stack into an opening patterned in said photoresist layer, and including performing a wet etch lift-off operation to remove said photoresist layer.

21. The method of claim 16, wherein said providing step includes depositing a third material on the substrate and removing a portion of the third material to produce the first material.

22. The method of claim 16, including, after said depositing step and before said etching step, providing on said second portion of the stack and said first material an etch mask covering all of said second portion of the stack and part of said first material.

23. The method of claim 22, wherein said etching step includes etching away a remainder of the first material other than said part of the first material.

24. The method of claim 22, wherein said step of providing said etch mask includes depositing on said second portion of the stack and said first material a mask layer covering said second portion of the stack and said first material, providing on said mask layer a photoresist mask that covers a portion of said mask layer, and etching away a remainder of said mask layer other than said portion of said mask layer.

25. The method of claim 22, wherein said etch mask is one of an oxide etch mask and a nitride etch mask.

26. The method of claim 16, including, before said etching step, removing a portion of said second material.

27. The method of claim 16, including performing said etching step before said depositing step.

28. The method of claim 16, including performing said depositing step before said etching step.

29. The method of claim 1, including, before said etching step, covering said first portion with a protective cap layer.

30. The method of claim 29, wherein said first-mentioned depositing step includes said covering step.

31. The method of claim 29, wherein said first portion includes a magnetic layer and a tunnel barrier layer.

32. The method of claim 29, including, after said etching step and before said last-mentioned depositing step, etching part of said protective cap layer to expose part of said first portion while maintaining another part of said first portion covered by said protective cap layer.

33. The method of claim 32, wherein said last-mentioned etching step includes etching through said protective cap layer an opening having a cross-sectional area that is smaller than a cross-sectional area of said first portion in a plane where said first portion generally adjoins said protective cap layer.

34. The method of claim 33, wherein said last-mentioned depositing step includes depositing said second portion into said opening.

35. The method of claim 34, wherein said first portion includes a magnetic layer and a tunnel barrier layer.

36. The method of claim 33, including, after said first-mentioned etching step and before said last-mentioned etching step, providing a further layer in overlying relationship relative to said protective cap layer and etching through said further layer a further opening having a cross-sectional area approximately equal to said cross-sectional area of said opening in said protective cap layer.

37. The method of claim 36, wherein said last-mentioned depositing step includes performing a directional deposition process to deposit said second portion into said further opening.

38. The method of claim 36, wherein said further layer is a dielectric layer.

39. The method claim 32, wherein said step of etching said protective cap layer includes performing an in situ etch of said protective cap layer.

40. The method of claim 29, wherein said protective cap layer is one of a Ru layer and a DLC layer.

41. The method of claim 40, wherein said protective cap layer has a thickness in a range of approximately 50–100 angstroms.

42. The method of claim 29, wherein said protective cap layer has a thickness in a range of approximately 50–100 angstroms.

43. The method of claim 17, wherein said depositing step includes depositing on the first material a photoresist layer that is patterned for use in defining said second portion of the stack.

44. The method of claim 43, wherein said second material depositing step includes depositing said second portion of the stack into an opening patterned in said photoresist layer, and including performing a wet etch lift-off operation to remove said photoresist layer.

45. The method of claim 17, wherein said first portion of the stack includes a magnetic layer and a tunnel barrier layer.

46. The method of claim 17, after said second depositing step and before said etching step, providing on said second portion of the stack and said first material an etch mask covering all of said second portion of the stack and part of said first material.

47. The method of claim 46, wherein said etching step includes etching away a remainder of the first material other than said part of the first material.

48. The method of claim 46, said step of providing said etch mask includes depositing on said second portion of the stack and said first material a mask layer covering said second portion of the stack and said first material, providing on said mask layer a photoresist mask that covers a portion of said mask layer, and etching away a remainder of said mask layer other than said portion of said mask layer.

49. The method of claim 46, wherein said etch mask is one of an oxide etch mask and a nitride etch mask.

* * * * *

UNITED STATES PATENT AND TRADEMARK OFFICE
CERTIFICATE OF CORRECTION

PATENT NO. : 6,884,630 B2
DATED : April 26, 2005
INVENTOR(S) : Gupta et al.

It is certified that error appears in the above-identified patent and that said Letters Patent is hereby corrected as shown below:

Column 6,
Line 11, delete "firs" and insert -- first --.

Signed and Sealed this

Sixteenth Day of August, 2005

JON W. DUDAS
*Director of the United States Patent and Trademark Office*